US008754980B2

(12) United States Patent
Anderson et al.

(10) Patent No.: US 8,754,980 B2
(45) Date of Patent: Jun. 17, 2014

(54) ELECTROMAGNETICALLY SHIELDED CAMERA AND SHIELDED ENCLOSURE FOR IMAGE CAPTURE DEVICES

(75) Inventors: David Anderson, Champlin, MN (US); George Anderson, Champlin, MN (US); David B. Jackson, Excelsior, MN (US); Greg Fuchs, River Falls, WI (US); Gale Nordling, Excelsior, MN (US); Wallace Jensen, Centerville, MN (US); Frederick R. Faxvog, Long Lake, MN (US)

(73) Assignee: Emprimus, LLC, St. Louis Park, MN (US)

( * ) Notice: Subject to any disclaimer, the term of this patent is extended or adjusted under 35 U.S.C. 154(b) by 0 days.

(21) Appl. No.: 13/289,861

(22) Filed: Nov. 4, 2011

(65) Prior Publication Data

US 2012/0140107 A1 Jun. 7, 2012

Related U.S. Application Data (60) Provisional application No. 61/410,755, filed on Nov. 5, 2010, provisional application No. 61/425,146, filed on Dec. 20, 2010, provisional application No. 61/430,398, filed on Jan. 6, 2011.

(51) Int. Cl.
*H04N 5/225* (2006.01)
(52) U.S. Cl.
USPC .......................................................... 348/373
(58) Field of Classification Search
USPC ............................. 348/65, 79, 341, 373–376, 348/333.01–333.05; 361/818; 396/535; 382/115, 118
See application file for complete search history.

(56) References Cited

U.S. PATENT DOCUMENTS

| 3,009,984 | A | 11/1961 | Lindgren |
| 3,075,818 | A | 1/1963 | Fay |
| 3,158,016 | A | 11/1964 | Fay |
| 3,189,394 | A | 6/1965 | Fay |
| 3,231,663 | A | 1/1966 | Schwartz |
| 3,297,383 | A | 1/1967 | Fay |

(Continued)

FOREIGN PATENT DOCUMENTS

| EP | 0 668 692 A1 | 8/1995 | |
| EP | 1 114 423 B1 | 2/2007 | |
| GB | 294513 | 7/1928 | |
| JP | 11-239288 | * 8/1999 | ............. H04N 5/225 |

OTHER PUBLICATIONS

Invitation to Pay Additional Fees with Partial International Search cited in International Application No. PCT/US2011/059392 mailed Mar. 28, 2012.

(Continued)

*Primary Examiner* — Twyler Haskins
*Assistant Examiner* — Akshay Trehan
(74) *Attorney, Agent, or Firm* — Merchant & Gould, P.C.

(57) ABSTRACT

Camera arrangements that can include electromagnetic protection, such as from EMP/IEMI events, is disclosed. One example camera arrangement includes a camera including a viewfinder having a lens, and an electromagnetically shielded enclosure defining an interior volume containing the camera and configured to include at least one opening aligned with the lens. The camera arrangement includes an electromagnetically dampening barrier disposed across the at least one opening, the barrier configured to shield the interior volume of the enclosure from electromagnetic signals while exposing an optical path between the lens and objects external to the enclosure.

18 Claims, 4 Drawing Sheets

(56) References Cited

U.S. PATENT DOCUMENTS

| | | | |
|---|---|---|---|
| 3,390,491 A | 7/1968 | Howard et al. |
| 3,962,550 A | 6/1976 | Kaiserswerth |
| D245,303 S | 8/1977 | Gazarek |
| 4,060,709 A | 11/1977 | Hanson |
| 4,066,305 A | 1/1978 | Gazarek |
| D248,003 S | 5/1978 | Gazarek |
| 4,102,554 A | 7/1978 | Reimer |
| 4,115,656 A | 9/1978 | Aitel |
| 4,177,353 A | 12/1979 | McCormack |
| 4,655,012 A | 4/1987 | Downey et al. |
| 4,660,014 A | 4/1987 | Wenaas et al. |
| 4,677,251 A | 6/1987 | Merewether |
| 4,691,483 A | 9/1987 | Anderson |
| 4,748,790 A | 6/1988 | Frangolacci |
| 4,750,957 A | 6/1988 | Gustafson |
| 4,755,630 A | 7/1988 | Smith et al. |
| H526 H | 9/1988 | Miller |
| 4,787,181 A | 11/1988 | Witten et al. |
| D300,097 S | 3/1989 | Cook |
| 4,884,171 A | 11/1989 | Maserang et al. |
| 4,894,489 A | 1/1990 | Takahashi et al. |
| 4,913,476 A | 4/1990 | Cook |
| 5,045,636 A | 9/1991 | Johnasen et al. |
| 5,079,388 A | 1/1992 | Balsells |
| 5,117,066 A | 5/1992 | Balsells |
| 5,136,119 A | 8/1992 | Leyland |
| 5,136,453 A | 8/1992 | Oliver |
| 5,148,111 A | 9/1992 | Shiloh et al. |
| 5,179,489 A | 1/1993 | Oliver |
| 5,184,311 A | 2/1993 | Kraus et al. |
| 5,190,479 A | 3/1993 | Jordi |
| 5,191,544 A | 3/1993 | Benck et al. |
| 5,241,132 A | 8/1993 | McCormack |
| 5,414,366 A | 5/1995 | Rogers |
| 5,436,786 A | 7/1995 | Pelly et al. |
| 5,465,534 A | 11/1995 | Mittag |
| 5,594,200 A | 1/1997 | Ramsey |
| 5,600,290 A | 2/1997 | Anderson, II |
| 5,685,358 A * | 11/1997 | Kawasaki et al. ............. 164/120 |
| 5,749,178 A | 5/1998 | Garmong |
| 5,751,530 A | 5/1998 | Pelly et al. |
| 5,828,220 A | 10/1998 | Carney et al. |
| 5,983,578 A | 11/1999 | Huttie et al. |
| 6,011,504 A | 1/2000 | Tan |
| 6,068,009 A | 5/2000 | Paes et al. |
| 6,090,728 A | 7/2000 | Yenni, Jr. et al. |
| 6,157,546 A | 12/2000 | Petty et al. |
| 6,185,065 B1 | 2/2001 | Hasegawa et al. |
| 6,210,787 B1 | 4/2001 | Goto et al. |
| 6,292,373 B1 | 9/2001 | Li et al. |
| 6,320,123 B1 | 11/2001 | Reimers |
| 6,324,075 B1 | 11/2001 | Unrein et al. |
| 6,346,330 B1 | 2/2002 | Huang et al. |
| 6,377,473 B1 | 4/2002 | Huang et al. |
| 6,380,482 B1 | 4/2002 | Norte et al. |
| 6,426,459 B1 | 7/2002 | Mitchell |
| 6,442,046 B1 | 8/2002 | Sauer |
| 6,485,595 B1 | 11/2002 | Yenni, Jr. et al. |
| 6,542,380 B1 | 4/2003 | Hailey et al. |
| 6,542,384 B1 | 4/2003 | Radu et al. |
| 6,613,979 B1 | 9/2003 | Miller et al. |
| 6,683,245 B1 | 1/2004 | Ogawa et al. |
| 6,838,613 B2 | 1/2005 | Kopf |
| 6,870,092 B2 | 3/2005 | Lambert et al. |
| 6,872,971 B2 | 3/2005 | Hutchinson et al. |
| 6,891,478 B2 | 5/2005 | Gardner |
| 7,071,631 B2 | 7/2006 | Howard, II |
| 7,210,557 B2 | 5/2007 | Phillips et al. |
| 7,258,574 B2 | 8/2007 | Barringer et al. |
| 7,369,416 B2 | 5/2008 | Plabst |
| 7,418,802 B2 | 9/2008 | Sarine et al. |
| 7,420,742 B2 | 9/2008 | Wood et al. |
| 7,475,624 B1 | 1/2009 | Daily |
| 7,498,524 B2 | 3/2009 | Brench |
| 7,504,590 B2 | 3/2009 | Ball |
| 7,512,430 B2 | 3/2009 | Nakamura |
| 7,515,219 B2 | 4/2009 | Bozzer et al. |
| 7,560,135 B2 | 7/2009 | Kotsubo et al. |
| 7,561,444 B2 | 7/2009 | He |
| 7,576,289 B2 | 8/2009 | Kessel |
| 7,589,943 B2 | 9/2009 | Ramirez et al. |
| 7,710,708 B2 | 5/2010 | Park et al. |
| 7,839,020 B2 | 11/2010 | Nakanishi |
| 8,085,554 B2 | 12/2011 | Holdredge et al. |
| 8,183,995 B2 | 5/2012 | Wang et al. |
| 8,351,221 B2 | 1/2013 | Siomkos et al. |
| 8,358,512 B2 | 1/2013 | Shiroishi et al. |
| 8,358,515 B2 | 1/2013 | Chen et al. |
| 8,373,998 B2 | 2/2013 | Ricci et al. |
| 8,406,012 B2 | 3/2013 | Kim |
| 2001/0046128 A1 | 11/2001 | Ogata |
| 2003/0024172 A1 | 2/2003 | Lyons et al. |
| 2003/0029101 A1 | 2/2003 | Lyons |
| 2003/0042990 A1 | 3/2003 | Schumacher |
| 2003/0174487 A1 | 9/2003 | Garmong |
| 2004/0112205 A1 | 6/2004 | MacDougall |
| 2004/0232847 A1 | 11/2004 | Howard, II |
| 2005/0174749 A1 | 8/2005 | Liikamaa et al. |
| 2005/0247471 A1 | 11/2005 | Archambeault et al. |
| 2006/0272857 A1 | 12/2006 | Arnold |
| 2006/0274517 A1 | 12/2006 | Coffy |
| 2007/0002547 A1 | 1/2007 | Garmong |
| 2007/0025095 A1 | 2/2007 | Beall et al. |
| 2007/0093135 A1 | 4/2007 | Luo et al. |
| 2007/0105445 A1 | 5/2007 | Manto et al. |
| 2007/0126871 A1 | 6/2007 | Henninger, II et al. |
| 2007/0127129 A1 | 6/2007 | Wood et al. |
| 2007/0158914 A1 | 7/2007 | Tammaro et al. |
| 2008/0050172 A1 | 2/2008 | Simola et al. |
| 2008/0080158 A1 | 4/2008 | Crocker et al. |
| 2008/0250726 A1 | 10/2008 | Slagel et al. |
| 2009/0067141 A1 | 3/2009 | Dabov et al. |
| 2009/0125316 A1 | 5/2009 | Moore |
| 2009/0140499 A1 | 6/2009 | Kline |
| 2009/0229194 A1 | 9/2009 | Armillas |
| 2009/0244876 A1 | 10/2009 | Li et al. |
| 2009/0268420 A1 | 10/2009 | Long |
| 2009/0278729 A1 | 11/2009 | Bosser et al. |
| 2009/0291608 A1 | 11/2009 | Choi et al. |
| 2010/0103628 A1 | 4/2010 | Steffler |
| 2010/0116542 A1 | 5/2010 | Sugihara et al. |
| 2010/0128455 A1 * | 5/2010 | Ophoven et al. ............. 361/818 |
| 2010/0208433 A1 | 8/2010 | Heimann et al. |
| 2010/0315792 A1 | 12/2010 | Jones |
| 2011/0088940 A1 | 4/2011 | Nordling et al. |
| 2011/0222249 A1 | 9/2011 | Ruehl et al. |
| 2011/0267765 A1 | 11/2011 | Fuchs et al. |
| 2012/0113317 A1 | 5/2012 | Anderson et al. |
| 2012/0140431 A1 | 6/2012 | Faxvog et al. |
| 2012/0243846 A1 | 9/2012 | Jackson et al. |
| 2012/0326729 A1 | 12/2012 | Faxvog et al. |
| 2013/0170159 A1 | 7/2013 | Jiang |

OTHER PUBLICATIONS

International Search Report and Written Opinion for PCT Application No. PCT/US2011/059392, mailed Jun. 6, 2012.

Office Action dated Dec. 26, 2012, issued in U.S.Appl. No. 13/289,849.

Notice of Allowance dated Dec. 30, 2013, issued in U.S. Appl. No. 13/289,849.

Military Handbook 235-1B, Electromagnetic (Radiated) Environment Considerations for Design and Procurement of Electrical and Electronic Equipment, Subsystems and Systems, Part 1B, General Guidance, 20 Pages, 1993.

Military Handbook 237B, Department of Defense Handbook, Guidance for Controlling Electromagnetic Environmental Effects on Platforms, Systems, and Equipment, 248 Pages, 1997.

Military Handbook 253, Guidance for the Design and Test of Systems Protected Against the Effects of Electromagnetic Energy, 27 Pages, 1978.

Military Handbook 273, Survivability Enhancement, Aircraft, Nuclear Weapon Threat, Design and Evaluation Guidelines, 228 Pages, 1983.

(56) References Cited

OTHER PUBLICATIONS

Military Handbook 411B, Power and the Environment for Sensitive DoD Electronic Equipment (General), vol. 1, 658 pages, 1990.
Military Handbook 419A, Grounding, Bonding, and Shielding for Electronic Equipments and Facilities, vol. 1 of 2 Volumes, Basic Theory, 812 Pages, 1987.
Military Handbook 1857, Grounding, Bonding and Shielding Design Practices, 185 Pages, 1998.
Military Handbook 5961A, List of Standard Semiconductor Devices, 33 pages, 1999.
Military Standard 188-124B, Grounding, Bonding and Shielding, for Common Long Haul/Tactical Communication Systems Including Ground Based Communications-Electronics Facilities and Equipments, 41 Pages, 1992.
Military Standard 188-125-1, Department of Defense Interface Standard, High-Altitude Electromagnetic Pulse (HEMP) Protection for Ground-Based C4I Facilities Performing Critical, Time-Urgent Missions (Part 1—Fixed Facilities), 107 Pages, 1998.
Military Standard 188-125-2, Department of Defense Interface Standard, High-Altitude Electromagnetic Pulse (HEMP) Protection for Ground-Based C4I Facilities Performing Critical, Time-Urgent Missions (Part 2—Transportable Systems), 148 Pages, 1999.
Military Standard 188-125, High-Altitude Electromagnetic Pulse (HEMP) Protection for Ground-Based C4I Facilities Performing Critical, Time-Urgent Missions (vol. 1—Fixed Facilities), 114 Pages, Feb. 1994.
Military Standard 220C, Department of Defense—Test Method Standard—Method of Insertion Loss Measurement, 19 Pages, 2009.
Military Standard 285—Notice of Cancellation—MIL-STD-285, dated 1956 canceled, 17 Pages, 1997.
Military Standard 285, Military Standard Attenuation Measurements for Enclosures, Electromagnetic Shielding, for Electronic Test Purposes, 15 Pages, 1956.
Military Standard 461C, Electromagnetic Emission and Susceptibility Requirements for the Control of Electromagnetic Interference, 183 Pages, 1986.
Military Standard 461E, Requirements for the Control of Electromagnetic Interference Characteristics of Subsystems and Equipment, 253 Pages, 1999.
Military Standard 461F, Requirements for the Control of Electromagnetic Interference Characteristics of Subsystems and Equipment, 269 Pages, 2007.
Military Standard 462, Electromagnetic Interference Characteristics, 80 Pages, 1967.
Military Standard 462D, Measurement of Electromagnetic Interference Characteristics, 203 Pages, 1993.
Military Standard 464, Electromagnetic Environmental Effects Requirements for Systems, 116 pages, 1997.
Military Standard 464A, Electromagnetic Environmental Effects Requirements for Systems, 121 pages, 2002.
Military Standard 469B, Radar Engineering Interface Requirements, Electromagnetic Compatibility, 98 Pages, 1996.
Military Standard 1542B (USAF), Electromagnetic Compatibility and Grounding Requirements for Space System Facilities, 52 Pages, 1991.
Military Handbook 1195, Radio Frequency Shielded Enclosures, 86 Pages, Sep. 1988.
IEEE Std 299-1997, IEEE Standard Method for Measuring the Effectiveness of Electromagnetic Shielding Enclosures, 44 Pages, 1997.
Leland H. Hemming, Architectural Electromagnetic Shielding Handbook—A Design Specification Guide, IEEE Press, 232 Pages, 1991.
USAF Handbook for the Design and Construction of HEMP/TEMPEST Shielded Facilities, AF Regional Civil Engineer Central Region, Dallas, Texas, 39 Pages, 1986.
ETS-Lindgren—High Performance EMI/RFI Shielding Solutions, 2 Pages, 2002.
ETS-Lindgren—Double Electrically Isolated RF Enclosures, for Industrial, Communication, and Research and Development Applications, 8 Pages, 2005.
ETS-Lindgren—Tempest Information Processing System (TIPS), 2 Pages, 2008.
ETS-Lindgren—Table Top Enclosure—5240 Series, 2 Pages, 2009.
ETS-Lindgren—Auto Latching Door System, 2 Pages, (undated).
ETS-Lindgren—RF Shielded Doors, 5 Pages, (undated).
NSA-94-106, National Security Agency Specification for Shielded Enclosures, 9 Pages, 1994.
Holland Shielding Systems BV, Shielding Gaskets With or Without Water Seal (EMI-RFI-IP Gaskets), 2 Pages, (undated).
Holland Shielding Systems BV, EMI-RFI-EMP—Shielded Doors for Faraday Cages and EMI-RFI Shielded Room, 5 Pages, (undated).
Holland Shielding Systems BV, Innovative EMI Shielding Solutions—Gasket Selection, 36 Pages, (undated).
Equipto Electronic Corporation—Technical Guide to EMI/RF Suppression in Electronic Cabinets, 16 Pages, Apr. 2005.
Crenlo-Emcor-Product-Options-Doors, 12 Pages, (undated).
RFI/EMI Shielded Cabinets and Features Available, 4 Pages, (undated).
Special Door Company, Radiation Shielding Doors: SH Door Tech, 2 Pages, (undated).
Special Door Company, EMP Doors: Electro Magnetic Pulse Doors, 3 Pages, (undated).
Braden Shielding Systems, Anechoic Chambers, EMC Chambers, MRI Enclosures, 1 Page, (undated).
Magnetic Shield Corp.—Bensenville, Illinois, Magnetic Shielding, 2 Pages, (undated).
EEP—Electromagnetic Radiation Shielding & Magnetic Field Shielding Technology—Products and Services, 3 Pages, (undated).
Fleming—RF & EMI Shielded Doors, Radiation Shielded Doors, 3 Pages, (undated).
H. Bloks, "NEMP/EMI Shielding," EMC Technology, vol. 5, No. 6, Nov.-Dec. 1986, 5 Pages.
W.E. Curran, "New Techniques in Shielding," Item, 1984, 9 Pages.
W. E. Curran, "Shielding for HEMP/TEMPEST Requirements," Item, 1988, 10 Pages.

\* cited by examiner

ELECTROMAGNETICALLY SHIELDED CAMERA AND SHIELDED ENCLOSURE FOR IMAGE CAPTURE DEVICES

CROSS REFERENCE TO RELATED APPLICATIONS

The present application claims priority from U.S. Provisional Patent Application No. 61/410,755 filed on Nov. 5, 2010, U.S. Provisional Patent Application No. 61/425,146 filed on Dec. 20, 2010, and U.S. Provisional Patent Application No. 61/430,398 filed on Jan. 6, 2011, the disclosures of each of which are hereby incorporated by reference in its entirety.

TECHNICAL FIELD

The present disclosure relates to structures for protection of electronic devices from electromagnetic events. In particular, the present disclosure relates to an electromagnetically shielded video or infrared camera and a shielded enclosure for image capture devices.

BACKGROUND

Exposure to electromagnetic fields can cause interference or damage to electrical equipment, causing that equipment to malfunction or rendering it nonoperational. For example, electrical equipment and electronics can be destroyed, or otherwise fail in the event of a strong electromagnetic pulse or intentional electromagnetic interference event (EMP/IEMI).

EMP/IEMI events typically take one of two forms. First, high field events correspond to short-duration, high voltage events (e.g., up to and exceeding 100 kilovolts per meter), and typically are of the form of short pulses of narrow-band or distributed signals (e.g., in the frequency range of 14 kHz to 10 GHz). These types of events typically generate high voltage differences in equipment, leading to high induced currents and burnout of electrical components. Second, low field events (e.g., events in the range of 0.01 to 10 volts per meter) are indications of changing electromagnetic environments below the high field damaging environments, but still of interest in certain applications.

Existing systems are used to adjust to a narrow range of threats, and thus systems developed to address a certain problem are not useful to address other problems necessitating electromagnetic shielding that are exposed during use of other electronic equipment. One such unaddressed concern is for example equipment related to surveillance, such as video and infrared cameras. Typically, video camera lenses require exposure to an external environment to provide a field of view for that camera to capture. In circumstances where reliable operation through possibly damaging events is desirable, such as in the case of security cameras or sensitive image capture equipment, there is currently no reliable way to ensure such operation in the case of exposure of the camera to possible damage due to EMP/IEMI events.

For these and other reasons, improvements are desirable.

SUMMARY

In accordance with the following disclosure, the above and other issues are addressed by the following:

In a first aspect, an electromagnetically protected camera arrangement includes a camera including a viewfinder having a lens. The camera arrangement also includes an electromagnetically shielded enclosure defining an interior volume containing the camera and configured to include at least one opening aligned with the lens. The camera arrangement also includes an electromagnetically dampening barrier disposed across the at least one opening, the barrier configured to shield the interior volume of the enclosure from electromagnetic signals while exposing an optical path between the lens and objects external to the enclosure.

In a second aspect, a camera arrangement includes a video or infrared camera including a viewfinder having a lens, and an electromagnetically shielded enclosure defining an interior volume containing the video camera and configured to include at least one opening aligned with the lens. The camera arrangement also includes an electrical filter positioned along a surface of the electromagnetically shielded enclosure and configured to receive an electrical signal external to the electromagnetically shielded enclosure and pass a filtered signal to the video camera. The camera arrangement further includes an electromagnetically dampening barrier disposed across the at least one opening, the barrier configured to shield the interior volume of the enclosure from electromagnetic signals while exposing an optical path between the lens and objects external to the enclosure, wherein the electromagnetically dampening barrier is positioned at a distance from the lens of the camera shorter than a focal length of the lens.

In a third aspect, an electromagnetically shielded camera arrangement includes a video or infrared camera including a viewfinder having a lens, and an electromagnetically shielded metal enclosure defining an interior volume containing the video camera and configured to include at least one opening aligned with the lens. The electromagnetically shielded camera arrangement includes an electrical filter positioned along a surface of the electromagnetically shielded metal enclosure and configured to receive an electrical signal external to the electromagnetically shielded metal enclosure and pass a filtered signal to the video camera. The electromagnetically shielded camera arrangement also includes an electromagnetic detector positioned within the interior volume and electrically connected to an antenna external to the electromagnetically shielded enclosure, the electromagnetic detector configured to detect EMP/IEMI events occurring in proximity to the electromagnetically shielded metal enclosure. The electromagnetically shielded camera arrangement also includes a shielding lens including a conductive coating configured to shield the interior volume of the electromagnetically shielded metal enclosure from EMP/IEMI events while exposing an optical path between the lens and objects external to the electromagnetically shielded metal enclosure, wherein the shielding lens is positioned at a distance from the lens of the camera shorter than a focal length of the lens.

DETAILED DESCRIPTION

Various embodiments of the present invention will be described in detail with reference to the drawings, wherein like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

In general, the present disclosure relates to an electromagnetically shielded video camera and a shielded enclosure for image capture devices. In some embodiments disclosed herein, the shielded enclosure is configured to shield the camera from Electromagnetic Pulse or Intentional Electromagnetic Interference (EMP/IEMI) events. The electromagnetically shielded camera arrangements disclosed herein mitigate a risk of damage to optical equipment in the event of an electromagnetic event that would otherwise cause such damage. As such, electromagnetically shielded camera arrangements can be used in a variety of secure locations where monitoring is desired, such as in secure facilities (e.g., banks, utility buildings, government buildings, or other locations). In certain embodiments, the systems of the present disclosure employ various types of barriers configured to dampen EMP/IEMI events or other high frequency, high amplitude signals, without blocking a viewing area visible to a camera lens, thereby protecting the camera without substantially degrading its performance.

The systems and arrangements of the present disclosure can also include, in some embodiments, an electrical power filter, an electrical signal line filter and a flat glass lens, or other suitable lens material, in front of the image capture device, where the flat lens has a thin film conductive metal coating on the glass surface or a screen embedded in the glass, to provide shielding of the detectors and electronics within the enclosure and within the camera.

Figure 1:
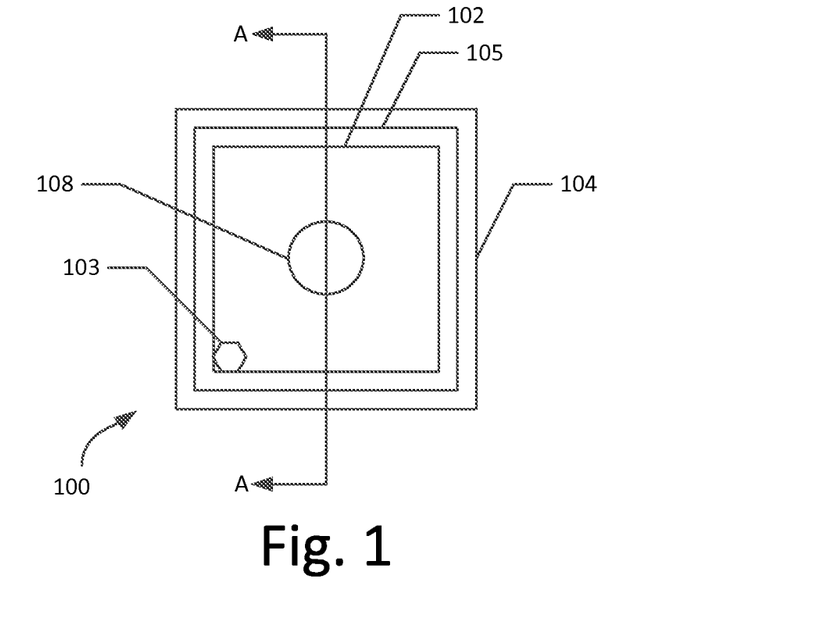
FIG. 1 is a front view of a schematic block diagram of an electromagnetically shielded camera, according to a possible embodiment.
Figure 2:
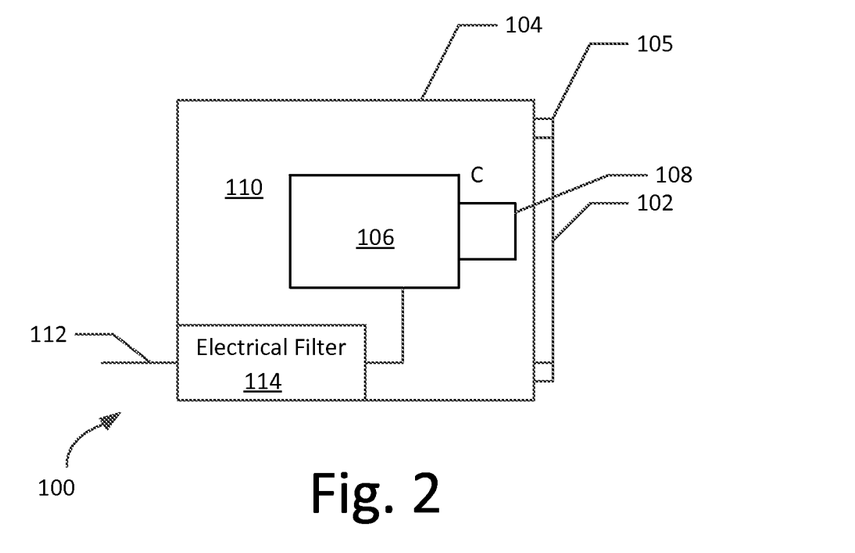
FIG. 2 is a side cross-sectional schematic block diagram view of the electromagnetically shielded camera of FIG. 1.

Referring now to FIGS. 1-2, an electromagnetically shielded camera 100 is shown, according to a possible embodiment of the present disclosure. FIG. 1 illustrates a front view of a schematic block diagram of the electromagnetically shielded camera 100, while FIG. 2 illustrates a side cross-sectional schematic view of that camera along an axis "A" depicted in FIG. 1.

In the embodiment shown, the electromagnetically shielded camera 100 includes a waveguide beyond cutoff 102 mounted in a wall of an enclosure 104. Specifically, the arrangement 100 includes a waveguide 102, usually comprised of small, thin-walled hexagonal or other shape cells 103, mounted in a wall of an enclosure 104 which encloses and shields a camera 106 and associated lens 108.

The waveguide beyond cutoff 102 can be, in various embodiments, constructed from metal or other materials, and is configured and positioned to allow optical communication between an internal area of the enclosure 104 and an area external to the enclosure, for example providing an optical path, or field of view, to a camera 106 and associated lens 108.

In general, the waveguide beyond cutoff 102 includes a honeycomb-shaped (i.e., hexagonal) or otherwise regularly-shaped geometric cells having a predetermined size and length, such that incident, high frequency signals external to the enclosure 104 are attenuated upon reaching the waveguide beyond cutoff 102. In certain embodiments, the waveguide 102 is a honeycomb structure and is designed such that it attenuates EMP and IEMI waves to a sufficient level (sometimes the level is 80 db with a frequency range from typically 14 kHz to as high as 10 GHz but other levels and other frequencies are obtainable to meet different levels of protection desired) so as to protect the electronics within the enclosure 104 and within the camera. It is understood that the waveguide 102 may be typically be made of one or more of the cells 103, such as honeycomb shaped hexagonal or other shape cells, round cells, square cells, vanes or other structures with small effective diameter and sufficient length through to provide the proper shielding. Usually, the air or in this case light passage is through the multiple openings in the waveguide 102 that are typically in the order of ⅟₁₆" to ⅛" in size, to provide shielding up to 10 GHz, with an associated L/D of 4 or more. For optical use, the vanes defining the cells 103 should have a minimized thickness to minimize interference with optical paths passing through the waveguide beyond cutoff 102.

In the embodiment shown, the waveguide 102 is oriented in line with the light passing to the lens 108, so that the thin walls of the cells 103 provide minimal distortion, blockage or degradation of the image, due to the L/D of the waveguide. The waveguide 102 is similar in principle to commercial waveguides designed to block entry of electromagnetic fields through air ducts used for cooling computers in shielded enclosures. Such waveguides are as described below. It is understood that other features of the enclosure must work in concert with the shielding of this light path to the lens 108 to provide complete, enclosed protection of the camera 106, including shielding of all necessary penetrations of the enclosure 104 from electromagnetic field penetration, interference or damage. Examples of a waveguide beyond cutoff useable in conjunction with the present disclosure are discussed below in connection with FIGS. 3-5.

The enclosure 104 is generally configured to be an electromagnetically-shielding enclosure, capable of shielding an interior volume 110 of the enclosure from undesirable electromagnetic signals (e.g., electromagnetic signals exceeding a particular amplitude and frequency). In various embodiments, the enclosure 104 can be constructed from conductive materials, such as a metal (e.g., sheet metal or aluminum) having a thickness generally sufficient to attenuate electromagnetic signals to acceptable levels. Although in the embodiment shown the enclosure 104 is generally rectangular, it is understood that the enclosure 104 could be any of a variety of shapes.

In an example embodiment, the enclosure 104 provides about 70 dB or more of attenuation. However, in alternative embodiments, other levels of attenuation could be provided as well. Various features relating to electromagnetically-shielding enclosures, as well as methods for sealing such enclosures, are provided in copending U.S. patent application Ser. No. 13/285,581, filed on Oct. 31, 2011, the disclosure of which is hereby incorporated by reference in its entirety.

In the embodiment shown, a frame 105 can be used to mount the waveguide beyond cutoff 102 to the enclosure 104. In various embodiments, the frame can provide a sealing connection to the enclosure 104, for example using an electromagnetically-shielded gasket arrangement or other arrangements, as explained in copending U.S. patent application Ser. No. 13/285,581, which was previously incorporated by reference.

As illustrated in further detail in FIG. 2, the camera 106 can be, in various embodiments, any of a variety of camera types, such as a still camera or video camera, and can be configured for use in various types of systems, such as security systems, closed-circuit monitoring systems, or other integrated systems. Alternatively, the camera 106 can be a stand-alone component, without a data connection external to the camera. In the embodiment shown, the camera 106 is powered by an external power signal line 112 which enters the enclosure 104 at an electrical filter 114. Various types of electrical filters could be used, such as a low-pass, band pass, or spark gap type filter; generally, the filter is selected to be capable of receiving a power signal (e.g., either a direct current signal having a predetermine voltage and amplitude, or an alternating current signal having an expected frequency and amplitude). The filter can be configured to prevent signals over a predetermined amplitude or frequency (e.g., within the range of typical EMP/IEMI events up to 10 GHz) from entering the enclosure via the power signal line 112.

The lens 108 can be any of a variety of types of automatically focusing or manually focused lenses. Generally, the lens 108 will be attached to a viewfinder of the camera 106, and have a focus length at a distance greater than the distance at which the waveguide beyond cutoff 102 is placed, such that the camera 106 does not focus on the waveguide, but instead focuses "through" the waveguide beyond cutoff on objects external to the enclosure 104. That is, the camera lens 108 can be selected, specific focal length and f-stop, such that the camera 106 focuses on objects in the far field. Hence the honeycomb waveguide material of the cells 103, which is in the near field, will be outside the depth of focus of the camera, and obscuration will be minimized. In this way, the imaging quality of the camera image will be retained with minimal distortion. In the embodiment shown, because the camera 106, lens 108 and waveguide 102 are mounted in alignment, viewing through the honeycomb waveguide cells 103 is nearly unobstructed.

In certain embodiments, an additional optical grade lens or window could optionally be located in "front" of the waveguide beyond cutoff 102 (external to the enclosure 104) to protect the camera and wave guide from exposure to environmental conditions.

Figure 3:
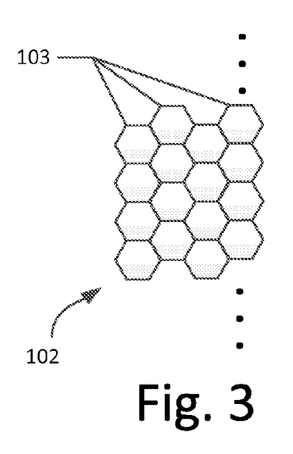
FIG. 3 is a schematic front layout of a portion of a waveguide beyond cutoff useable to implement aspects of the present disclosure.
Figure 4:
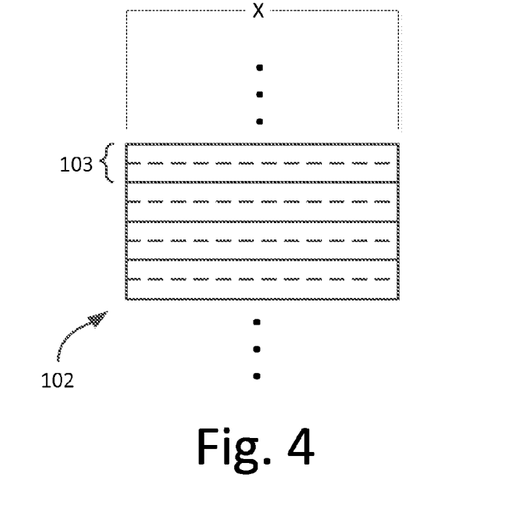
FIG. 4 is a schematic side layout of a portion of a waveguide beyond cutoff useable to implement aspects of the present disclosure.
Figure 5:
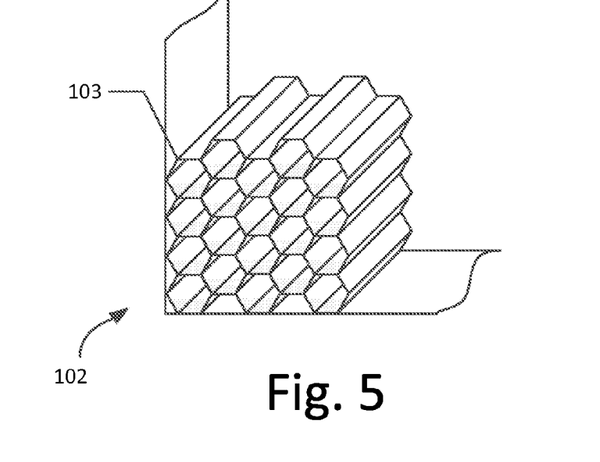
FIG. 5 is a schematic perspective view of a portion of a waveguide beyond cutoff useable to implement aspects of the present disclosure.

Referring to FIGS. 3-5 example diagrams of the honeycomb waveguide beyond cutoff 102 are illustrated. In various embodiments, cells 103 forming the waveguide beyond cutoff 102 can be constructed of either aluminum or steel, or other types of electromagnetically conductive materials. The honeycomb structure of the waveguide beyond cutoff 102 typically has ⅛" diameter (i.e., width) hexagonal holes forming an array of cells 103. To achieve the desired electromagnetic wave attenuation, typically 80 db, the thickness of the material (represented in FIG. 4 as length "X") is typically on the order of one inch, but may vary in different embodiments. For a ⅛" hole diameter this represents an length to diameter ratio of about eight (8). The honeycomb material of the waveguide beyond cutoff 102 can be plated or coated with a coating that is highly absorptive and non-reflective in the wavelengths of interest, to prevent unwanted off-axis light, or infrared, from entering the camera.

Figure 6:
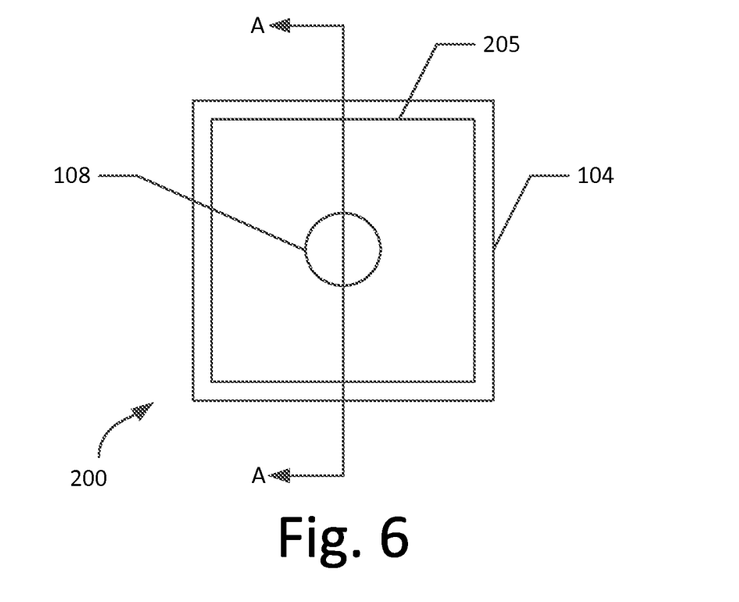
FIG. 6 is a front view of a schematic block diagram of an electromagnetically shielded camera, according to a second possible embodiment.
Figure 7:
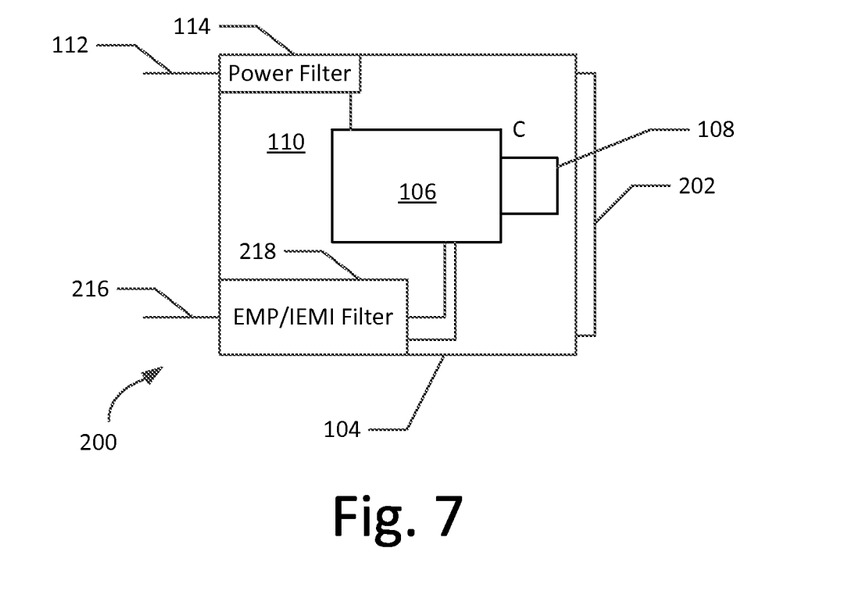
FIG. 7 is a side cross-sectional schematic block diagram view of the electromagnetically shielded camera of FIG. 6.

Referring to FIGS. 6-7, a second possible embodiment of an electromagnetically shielded camera 200 is shown, according to a possible embodiment of the present disclosure. In general the electromagnetically shielded camera 200 includes enclosure 104 which encloses and shields a camera 106 and associated lens 108, as discussed above. However, in this embodiment, the camera system 200 includes a flat lens 202 in front of the camera 106 and its associated lens 108. The lens 202 can be, in various embodiments, constructed from glass or some other transparent material, and has a thin film conductive metal coating on a surface. The thin film coating is selected to produce electromagnetic attenuation levels on the order of 30 to 50 db. It is recognized that the coating on the lens 202 comes at the expense of some reduction in light transmission; however, the camera lens 108 can be selected to have a specific focal length and f-stop such that the camera focuses on objects in the far field. As such, the thin film coating or screen material which is in the near field (i.e., within lens 202) will be outside the depth of focus of the camera 106, due for example, to the close distance between lenses 108, 202. In this way, the imaging ability of the camera 106 will not be significantly degraded by the coatings or the screen structure.

In certain embodiments, an electrical cable 216 can be used to communicate captured images to a remote system. In such embodiments, a filter 218, for example an EMP/IEMI filter, can be used to prevent signals from entering the enclosure 104 via the cable 216. Although in FIGS. 6-7 a power signal 112 and filter 114 are illustrated alongside the electrical cable 216 and filter 218, in alternative embodiments power can be delivered to the camera 106 via the electrical cable, such as in circumstances where a communication protocol including support for power over the same cable may be provided (e.g., via power over Ethernet, USB, or other cable configurations)

In an alternative embodiment to that shown in FIGS. 6-7, the film metal coatings or metal screen material discussed above with respect to lens 202 can be embedded directly into the lens 108 of the camera. In such embodiments, the housing of the camera 106 itself could be designed to be an effective shield against EMP and IEMI energy, and the shielded enclosure 104 removed and replaced in effect by that camera housing. Additionally, a power filter and suitable data communication filters such as those discussed above could be embedded into the camera housing.

Figure 8:
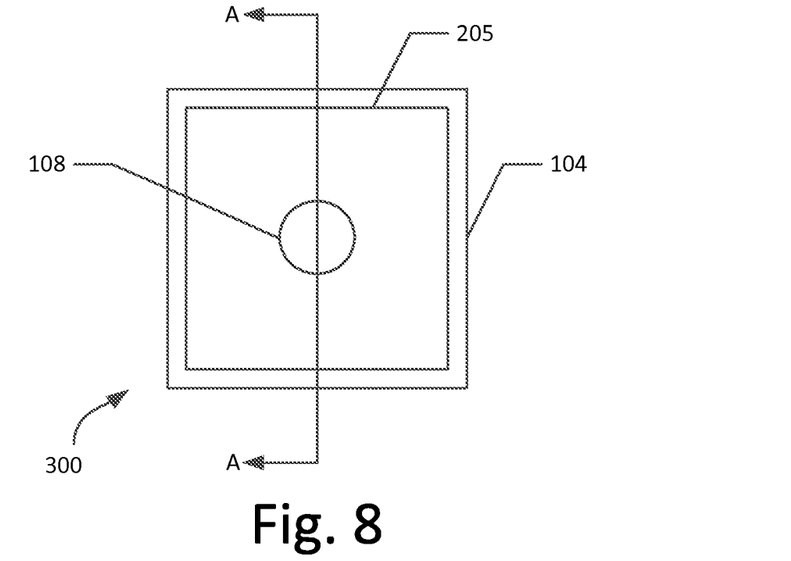
FIG. 8 is a front view of a schematic block diagram of an electromagnetically shielded camera, according to a third possible embodiment.
Figure 9:
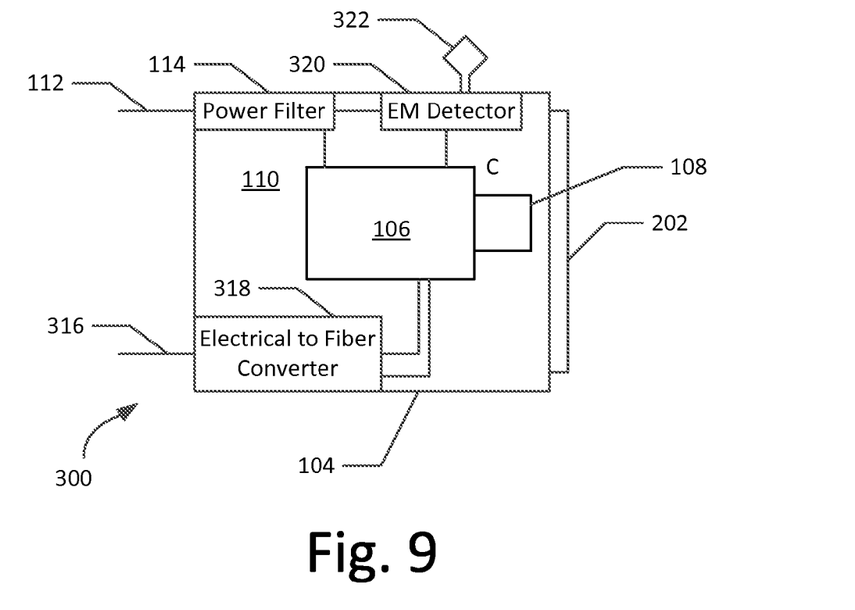
FIG. 9 is a side cross-sectional schematic block diagram view of the electromagnetically shielded camera of FIG. 8.

Referring now to FIGS. 8-9, a third possible embodiment of an electromagnetically shielded camera 300 is shown. In this embodiment, the electromagnetically shielded camera 300 includes an electromagnetically shielded enclosure 104 enclosing a video camera 106, as explained above. The system 300 also includes a flat glass lens 202 in front of the camera 106, which has a thin film conductive metal coating on the glass surface, and is used for shielding the camera lens as an entry point into the shielded enclosure for electromagnetic signals (e.g., as illustrated in FIGS. 6-7). The system 300 also includes a power filter 114 applied to a power signal 112, as previously explained in connection with FIGS. 1-2 and 6-7.

Compared to previous embodiments, the system 300 includes a fiber signal cable 316, in place of an electrical cable 216, from the camera 106 to remote storage media and display systems. A fiber signal cable 316 is generally less susceptible to electromagnetic pick-up and there by provides additional protection for the camera 106, as well as storage media and display systems attached thereto (both possibly included within the enclosure and remote from the enclosure). The fiber signal cable 316 provides a communication signal from the camera 106 and other detector equipment to a remote system (e.g., a computing system in a shielded enclosure). In this arrangement, the system includes an electrical to fiber converter 316 within the enclosure 104 and configured to convert between the electrical signals output from the camera 106 (and other sensors, such as the electromagnetic field detector described below) and a fiber optic signal used for communication.

Additionally, the system 300 in the embodiment shown includes an electromagnetic field detector 320 included within the enclosure. The electromagnetic field detector 320 can also be powered by the input power signal 112, via power filter 114, and can detect the existence of high electromagnetic signals outside the enclosure 104. An electromagnetic antenna 322 cooperates with the electromagnetic field detector 320 to determine the existence of such electromagnetic fields. Example electromagnetic field detectors and antennas are disclosed in U.S. patent application Ser. No. 12/906,902, entitled "Electromagnetic Field Detection Systems and Methods" and filed on Oct. 18, 2010, the disclosure of which is hereby incorporated by reference in its entirety. In some embodiments, the electromagnetic field detector 320 integrates collected data with images captured by the camera 106 to correlate events occurring near the camera 106 with the electromagnetic field experienced by the detector.

In certain embodiments, the electromagnetic field detector 320 can be integrated within the same enclosure as the camera 106; in other embodiments, the electromagnetic field detector 320 can be located in a separate enclosure or housing from the camera 106.

In certain alternative embodiments to those disclosed in FIGS. 6-9, a fiber cable can lead from the camera 106 through the enclosure 108, to communicate captured images to a remote system. A fiber cable would provide a cable system that is not be susceptible to electromagnetic pick-up and, thereby provides additional protection for the camera, as well as any storage media and display systems connected thereto. Additionally, this would remove a requirement of an electrical to fiber converter, such as converter 318 illustrated in FIG. 9.

Referring generally to FIGS. 1-9, it can be seen that the shielded enclosure and waveguide beyond cutoff arrangement disclosed herein protect the path or opening for light to enter a shielded enclosure and then to enter the camera lens and image sensors without providing a leakage path for electromagnetic fields potentially harmful to the electrical and electronic systems of the camera to enter the enclosure.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. An electromagnetically protected camera arrangement comprising:
a camera including a viewfinder having a lens;
an electromagnetically shielded enclosure defining an interior volume containing the camera and configured to include at least one opening aligned with the lens;
an electromagnetically dampening barrier disposed across the at least one opening, the barrier configured to shield the interior volume of the enclosure from electromagnetic interference signals while exposing an optical path between the lens and objects external to the enclosure; and
an electromagnetic detector positioned within the interior volume and electrically connected to an antenna external to the electromagnetically shielded enclosure, the electromagnetic detector configured to detect EMP/IEMI events occurring in proximity to the enclosure.

2. The electromagnetically protected camera arrangement of claim 1, wherein the camera comprises a video camera.

3. The electromagnetically protected camera arrangement of claim 1, wherein the electromagnetically dampening barrier comprises a lens including a conductive coating configured to shield the interior volume of the enclosure from EMP/IEMI events.

4. The electromagnetically protected camera arrangement of claim 1, further comprising a filter positioned within the interior volume, the filter configured to receive an electrical signal from external to the enclosure and pass a filtered electrical signal to the video camera.

5. The electromagnetically protected camera arrangement of claim 1, further comprising an electrical to optical converter within the interior volume and configured to convert optical signals to electrical signals received at the camera.

6. The electromagnetically protected camera arrangement of claim 1, wherein the electromagnetic detector correlates sensed electromagnetic field levels with the scene captured by the camera.

7. The electromagnetically protected camera arrangement of claim 1, wherein the camera comprises an infrared camera.

8. The electromagnetically protected camera arrangement of claim 1, wherein the enclosure is integrated with the camera as the camera housing.

9. The electromagnetically protected camera arrangement of claim 8, wherein the electromagnetically shielded enclosure comprises a metal enclosure.

10. The electromagnetically protected camera arrangement of claim 1, wherein the electromagnetically dampening barrier is positioned at a distance from the lens of the camera shorter than a focal length of the lens.

11. A camera arrangement comprising:
a video camera including a viewfinder having a lens;
an electromagnetically shielded enclosure defining an interior volume containing the video camera and configured to include at least one opening aligned with the lens;
an electrical filter positioned along a surface of the electromagnetically shielded enclosure and configured to receive an electrical signal external to the electromagnetically shielded enclosure and pass a filtered signal to the video camera;
an electromagnetically dampening barrier disposed across the at least one opening, the barrier configured to shield the interior volume of the enclosure from electromagnetic interference signals while exposing an optical path between the lens and objects external to the enclosure, wherein the electromagnetically dampening barrier is positioned at a distance from the lens of the camera shorter than a focal length of the lens; and
an electromagnetic detector positioned within the interior volume and electrically connected to an antenna external to the electromagnetically shielded enclosure, the electromagnetic detector configured to detect EMP/IEMI events occurring in proximity to the enclosure.

12. The camera arrangement of claim 11, wherein the electromagnetic detector correlates sensed electromagnetic field levels with the scene captured by the camera.

13. The camera arrangement of claim 11, wherein the electrical filter comprises a power signal filter.

14. The camera arrangement of claim 11, wherein the electrical filter is selected from a group of filters consisting of:
a low pass filter;
a band pass filter; and
a spark gap device.

15. The camera arrangement of claim 11, wherein the enclosure is integrated with the camera as the camera housing.

16. The camera arrangement of claim 11, further comprising an electrical to optical converter within the interior volume and configured to convert optical signals to electrical signals received at the camera.

17. An electromagnetically shielded camera arrangement comprising:
- a video camera including a viewfinder having a lens;
- an electromagnetically shielded metal enclosure defining an interior volume containing the video camera and configured to include at least one opening aligned with the lens;
- an electrical filter positioned along a surface of the electromagnetically shielded metal enclosure and configured to receive an electrical signal external to the electromagnetically shielded metal enclosure and pass a filtered signal to the video camera;
- an electromagnetic detector positioned within the interior volume and electrically connected to an antenna external to the electromagnetically shielded enclosure, the electromagnetic detector configured to detect EMP/IEMI events occurring in proximity to the electromagnetically shielded metal enclosure;
- a shielding lens including a conductive coating configured to shield the interior volume of the electromagnetically shielded metal enclosure from EMP/IEMI events while exposing an optical path between the lens and objects external to the electromagnetically shielded metal enclosure, wherein the shielding lens is positioned at a distance from the lens of the camera shorter than a focal length of the lens.

18. The electromagnetically shielded camera arrangement of claim 17, wherein the electromagnetic detector correlates sensed electromagnetic field levels with the scene captured by the camera.

* * * * *